United States Patent [19]
Jackson et al.

[11] Patent Number: 4,715,112
[45] Date of Patent: Dec. 29, 1987

[54] PICK-UP HEAD

[75] Inventors: Mark F. Jackson; Stephen P. Lawruk, both of Harrisburg; Dallas E. Schlegel, Mechanicsburg; Richard V. Spong, Etters, all of Pa.

[73] Assignee: AMP Incorporated, Harrisburg, Pa.

[21] Appl. No.: 944,058

[22] Filed: Dec. 10, 1986

[51] Int. Cl.$^4$ .............................................. H05K 13/04
[52] U.S. Cl. ....................................... 29/739; 29/741; 29/743; 29/759
[58] Field of Search .................. 29/739, 741, 743, 759; 901/40; 294/64.1; 414/737, 744 B

[56] References Cited
U.S. PATENT DOCUMENTS
4,631,815 12/1986 Bocchicchio et al. ................ 29/739

Primary Examiner—Carl E. Hall
Attorney, Agent, or Firm—Thomas G. Terrell

[57] ABSTRACT

A pick-up head (20) for a robot (2), comprises a body (28) having a plate (30) for attachment to the Z-axis shaft (18) of the robot (2). Two pick-up arms (34), pivotally attached to the body (2) each carry a riveting tool (26). The tools (26) are driven through a working stroke by a piston and cylinder drive unit (52) on the body (2), against the action of return springs (82). The tools (26) are inserted by the robot (2) lowering the pick-up head (20), into rivets at the ends of the leading electrical connector (25') at a pick-up station (21) and are arranged to be releasably secured to the rivets to allow the robot (2) to transfer the connector (24') to a circuit board (19) and to insert projecting ends of the rivets into holes in the board (10). The drive unit (52) is then actuated to cause the tools (26) to expand the projecting ends of the rivets, the tools (26) are released from the rivets, and the pick-up head (20) is raised by the robot (2). The pick-up arms (34) can be pivoted towards or away from each other and then fixed in a given angular position to allow for connector length.

11 Claims, 17 Drawing Figures

PICK-UP HEAD

This invention relates to a pick-up head for use in picking up a workpiece having a pair of hollow rivets depending in spaced relationship from a lower surface thereof and opening into an upper surface thereof, and moving the workpiece towards the board to place said lower surface thereon, thereby to insert said rivets into said predetermined holes in the board.

The invention particularly concerns such a pick-up head for use with a pick and place robot for picking up electrical connectors from a pick-up station and placing them on a circuit board.

Such a pick-up head is described in U.S. Pat. No. 4,631,815. The pick-up head described in that specification, is for use with workpieces, the rivets of which are spaced from one another by a predetermined distance. The present invention concerns a pick-up head, which is adjustable for use with workpieces, the rivets of which are spaced from one another by various distances.

A pick-up head according to the present invention, comprises a body having a central vertical axis and an upper face; means on said upper face for attaching the body to a longitudinally movable shaft with said central axis coincident with the axis of the shaft; a pair of workpiece pick-up arms, each pivotally attached at one end to the body, for movement towards and away from each other about pivotal axes extending alongside, and on opposite sides of, said central axis; means for releasably retaining said arms in desired relative angular positions about said pivotal axes; an elongate riveting tool mounted for axial movement in the other end of each pick-up arm in a direction parallel to said central axis; means for releasably securing each riveting tool to a rivet into which the tool has been inserted to allow the pick-up head to pick up the work piece, and drive means on said body for driving each riveting tool through a working stroke to secure the tool to said rivet, and to secure the rivet in said predetermined hole in said board and through a return stroke to withdraw said riveting tool from said rivet.

The pick-up arms can be set to a desired angular spacing corresponding to the spacing of the rivets in the workpiece. Said securing means may comprise means for evacuating a tube in which said riveting tool runs so that the rivet is held to the tool by air pressure, or means for expanding the tool to cause elastomeric friction pads thereon to be forced against the internal wall of the rivet. Although there is described in U.S. Pat. No. 4,533,075, the riveting tool which is arranged releasably to be secured to a rivet, by expanding the riveting tool, the rivet is frictionally gripped by means of serrations on the riveting tool.

The riveting tools may be ganged by means of a bar spanning the tools, the drive means comprising a pneumatic drive piston and cylinder unit fixed to the body and coupled through a linkage to the bar.

When a pick-up head according to a preferred embodiment of the invention, is provided on a pick and place robot for picking up electrical connectors from a pick-up station and placing them on a circuit board, the attachment means on said body, is secured to the Z-axis shaft of the robot and in operation, the shaft is lowered at an electrical connector pick-up station to insert the riveting tools into the rivets of an electrical connector at the station. The tools are then secured to the rivets by the securing means mentioned above and the Z-axis shaft is then raised with the connector secured to the pick-up head. The robot transfers the pick-up head to a position above a circuit board to which the connector is to be riveted, and then lowers the Z-axis shaft to place the depending portion of each rivet in a predetermined hole in the circuit board, after which the tools are driven through a working stroke by the drive means to expand said depending portions so that the connector is firmly fixed to the board, after which the said retaining means are released and the robot then raises the pick-up head, thereby withdrawing the tools from the rivets, leaving the connector secured to the board, and returns the pick-up head to the pick-up station to pick-up a further connector in the manner described above, and so on.

Prior to use, in a circuit assembly operation, the pick-up arms may be angularly adjusted with reference to a simple gauge in accordance with the spacing between the rivets, that is to say the connector length.

In the case where the riveting tools are arranged to be expanded to grip the rivets, the drive means is arranged to carry out its working stroke in two increments, that is to say an expanding increment and a riveting increment, and to this end, the drive means is preferably in the form of a double step, or tandem, pneumatic piston and cylinder unit.

For a better understanding of the invention and to show how it may be carried into effect, reference will now be made by way of example to the accompanying drawings in which.

Figure 1:
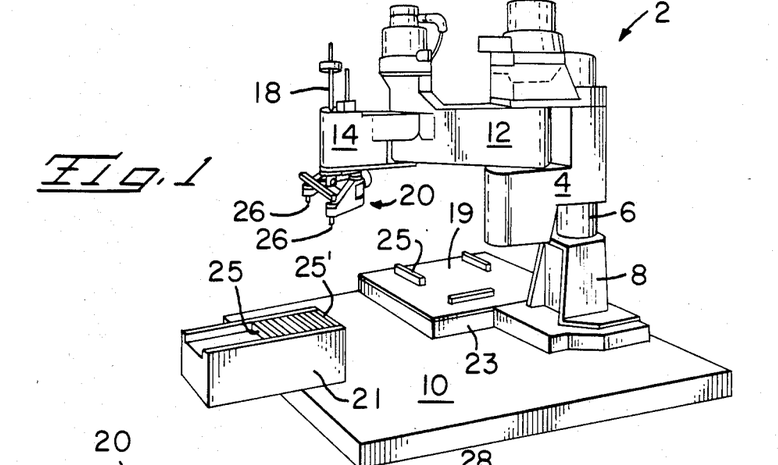
FIG. 1 is an isometric view of a pick and place robot operatively arranged in a work area in association with an electrical connector pick-up station and an electrical connector assembly station, the robot having a pick-up head for transferring electrical connectors from the pick-up station to the assembly station.

As shown in FIG. 1, a robot 2 comprises a body 4 mounted for rotation about, and movement along, the axis of a vertical shaft 6 in a stand 8 secured to a worktable 10. Mounted on the body 4 for rotation about a vertical axis, is a first arm 12 carrying at its end remote from the body 4, a second arm 14 which is rotatable with respect to the arm 12 also about a vertical axis. A vertical shaft 18 which is also rotatable about a vertical axis and which is extensible and retractable along such axis depends from the arm 14 at its end remote from the arm 12. The axis of the shaft 18 is known as the Z-axis of the robot. The body 4 is clamped, prior to use of the robot 2, in a desired angular position, and in a desired vertical position with respect to the shaft 6. The rotation of the arms 12 and 14, and the shaft 18, as well as the axial vertical movement of the shaft 18 are selectively controllable by means of a microprocessor (not shown) in accordance with a predetermined program.

An electrical connector pick-up head 20 is fixedly mounted on the shaft 18.

An assembly station 23 on the table 10 supports thereon, a circuit board 19. Also on the worktable 10, is a connector pick-up station 21 containing elongate electrical connectors 25, to be mounted, at accurately predetermined positions, on the board 19.

The robot 2 is operated under the control of the microprocessor to swing the head 20 over the pick-up station 21, to lower the head 20 to engage the leading connector 25' at the station 21, to cause riveting tools 26 depending from the head 20, to enter rivets (not shown in FIG. 1) at the ends of the leading connector 25', to cause the tools 26 releasably to be secured to the rivets, to raise the head 20, to swing it to a position over the board 19, to lower the head 20 to position the connector 25 on the board 19, to cause the tools 26 to expand portions of the rivets which extend beneath the board 19, to secure the connector 25' thereto, to raise the head 20 and so to withdraw the tools 26 from the rivets, and subsequently to cause the head 20 to pick up the next leading connector from the station 21 and to secure it to the board 19 in the manner described above. The program ensures that the head is rotated about the vertical axis of the shaft 18 so that it is suitably oriented for each pick up and place operation.

The first embodiment will now be described with reference to FIGS. 2 to 7E.

Figure 2:
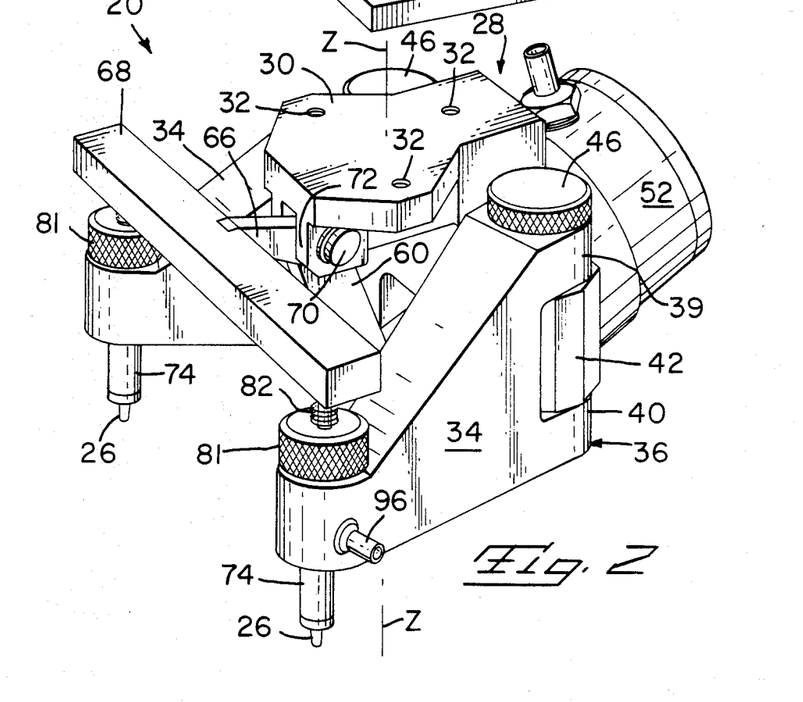
FIG. 2 is an isometric view of a first embodiment of the pick-up head.
Figure 3:
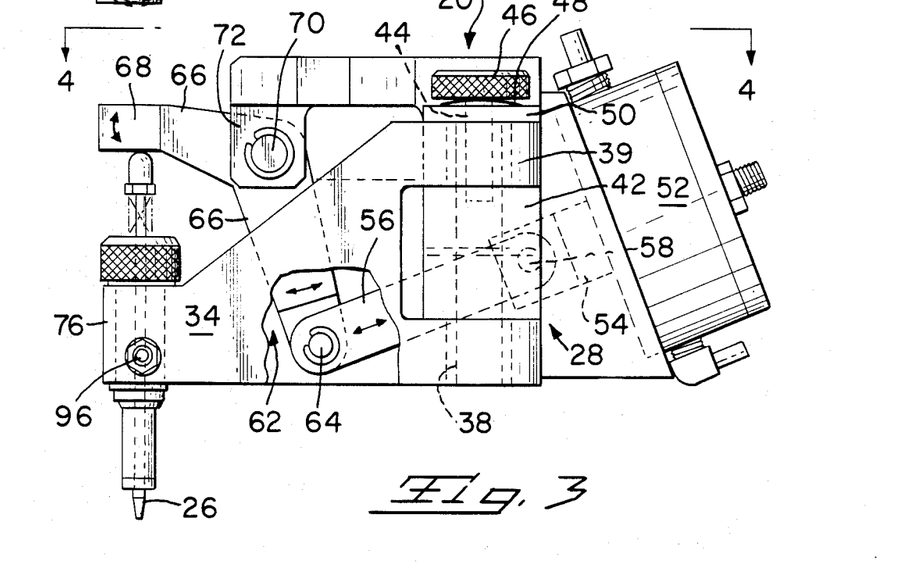
FIG. 3 is a side view of the pick-up head of FIG. 2.
Figure 4:
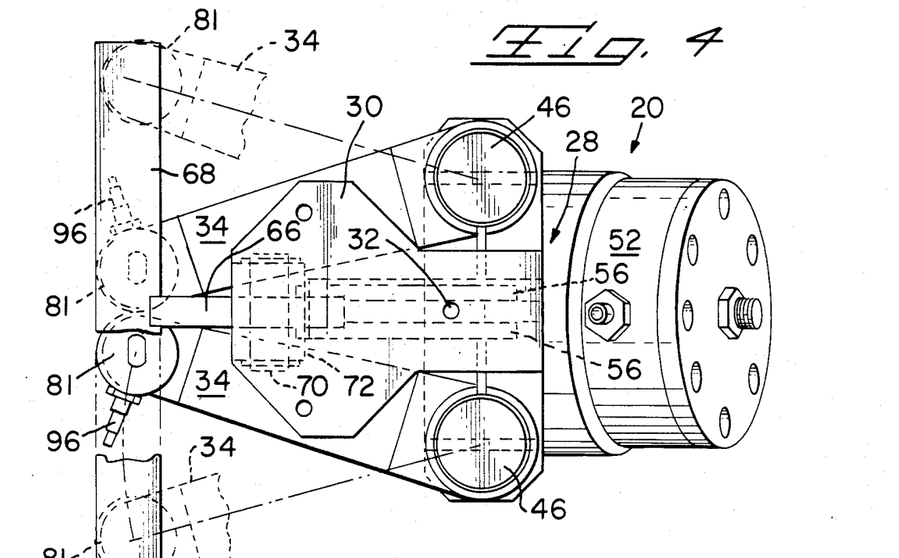
FIG. 4 is a view taken on the lines 4—4 of FIG. 3.

The pick-up head 20 comprises, as best seen in FIG. 2 to 4, a body, which is generally referenced 28, having a central vertical axis Z (FIG. 2) upon which axis is a mounting plate 30 formed with holes 32 to receive fasteners (not shown) for securing the head 20 to the shaft 18 of the robot so that the central axis Z coincides with the Z-axis of the robot 2. Two workpiece pick-up arms 34 are each pivotally attached, at one end 36, to the body 28 for movement towards and away from each other (as indicated in broken lines in FIG. 4) about pivotal axes, provided by pivot pins 38 extending parallel to and on opposite sides of the axis Z. Projecting from said one end 36 of each arm 34 is a pair of flanges 39 and 40 which are spaced from one another in the direction of the axis Z and which receive between them a lug 42 projecting laterally from the body 28, the respective pivot pin 38 extending through aligned bores in the flanges 39 and 40 and in the lug 42. There is threaded in each pivot pin 38, a screw 44 having a knurled head 46, a belleville washer 48 and a fiber washer 50, the later being beneath the former, as shown in FIG. 3, being interposed between the head 46 and the flange 39. Each screw 44 can be tightened manually, by means of its knurled head 46, to drive the flange 39 down against the lug 42 to secure the respective arm 34 in a desired angular position with respect to the other arm 34, about its pivot pin 38. Drive means for the tools 36, in the form of a pneumatic piston and cylinder unit 52 is secured to the body 28 behind the pick-up arms 34.

The piston rod 54 of the unit 52 is pivotally connected to one end of each of a pair of parallel first links 56 by means of a pivot pin 58, the other end of each link 56 being connected to a first arm 60 of a bell crank 62 by means of a pivot pin 64, the arm 60 extending between the links 56. The other arm 66 of the bell crank 62 is fixed to a bar 68 extending at right angles to the axis Z. The bell crank 62 is pivoted to the body 28, intermediate the arms 60 and 66 by means of a pivot pin 70 in a clevis 62 formed integrally with the body 28 and which receives the intermediate portion of the bell crank 62. When the unit 52 retracts its piston rod 64, the bar 68 is driven downwardly, the bar 68 being raised when the piston rod 54 is advanced.

Figure 5:
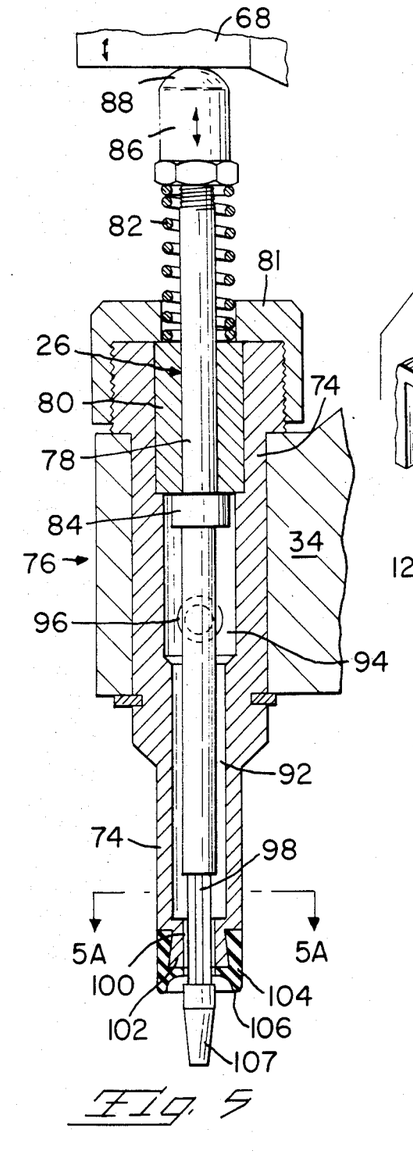
FIG. 5 is an axial sectional view of a riveting tool and its associated parts of the pick-up head of FIGS. 2 to 4.
Figure 5A:
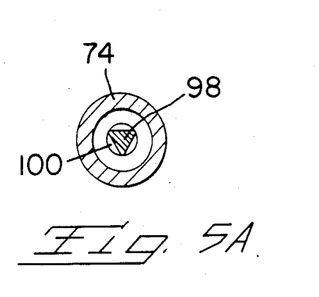
FIG. 5A is a view taken on the lines 5A–5A of FIG. 5.

As best seen in FIGS. 5 and 5A each riveting tool 26 is slidably mounted for vertical reciprocating motion in a direction parallel to the axis Z, in a tube 74 which is secured in the other end 76 of the respective arm 34. Each tool 26 comprises a solid shaft 78 which is slidable in a bushing 80 in the tube 74, to the upper end of which is threaded a nut 81 which secures the bushing 80 in position. The shaft 78 is urged in an upward direction by a return spring 82 to an extent limited by a collar 84 on the shaft 78, which collar is urged against the bushing 80 by the spring 82 which acts between the bushing 80 and a cap 86 on the shaft 78. Each cap 78 has a rounded free end portion 88 abutting the bar 68. The tools 26 are thereby ganged by the bar 68 so as to be simultaneously driven by the unit 52. Each cap 86 is threaded to its shaft 78 for adjustment of the stroke of the tool 26. The end portions 88 of the caps 86 slide along the bar 68, as the angular positions of the pick-up arms 34 are being adjusted.

There is secured to the collar 84, a shaft 90 which is received with play, in bore portions 92 and 94 of the sleeve 74, the later also receiving the collar 84. The bore portion 94 is of substantially greater cross-sectional area than the bore portion 92. An external evacuation nozzle 96 projecting laterally from the end 76 of each arm 34 communicates with the bore portion 94 and thus with the bore portion 92 and is connected by means of a hose, not shown, to a vacuum pump, not shown, in, and controlled by, the robot 2. There is formed on the shaft 90 a triangular cross section tool shaft 98 extending through a further bore portion 100 of the tube 74, which is of reduced cross section with respect to the bore portion 92, so that the wall of the bore portion 100 acts to guide the shaft 98 for movement in a direction precisely in parallel with the axis Z. The tube 74 is formed with an undercut free end portion 102 which is encircled by and secures in position, an elastomeric sealing grommet 104 through which the shaft 98 extends and which has a circular sealing lip 106, projecting beyond the free end of the tube 74. The shaft 98 terminates in a riveting head 107.

Figure 6:
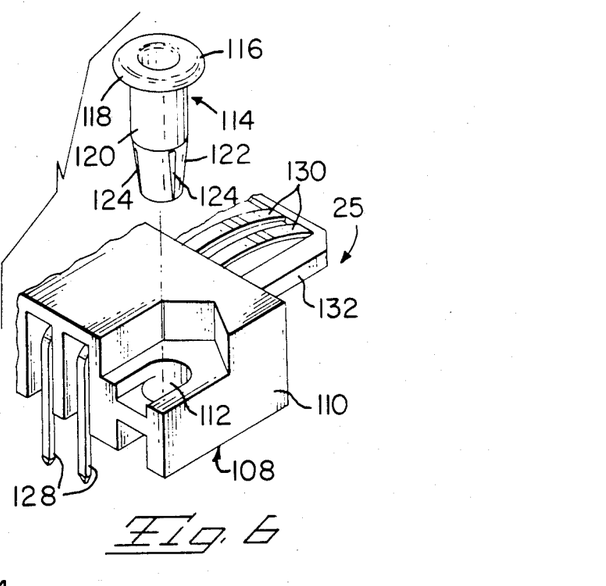
FIG. 6 is a fragmentary isometric view showing one end of an electrical connector with a rivet exploded therefrom.

Each connector 25 comprises an insulating housing 108 having at each end thereof a mounting flange 110, one of which is shown in FIG. 6. Each flange 110 has an opening 112 therein receiving a hollow rivet 114 having a head 116 with an overturned edge 118 which engages the upper surface of the flange 110 as shown in FIGS. 7A to 7D. There depends from the head 116, a hollow shaft 120 which is received in the opening 112 and terminates in a tapered portion 122 which depends below the bottom of the housing 108 and is formed with longitudinal slits 124 to assist its deformation as described below.

Figures 7A, 7B:
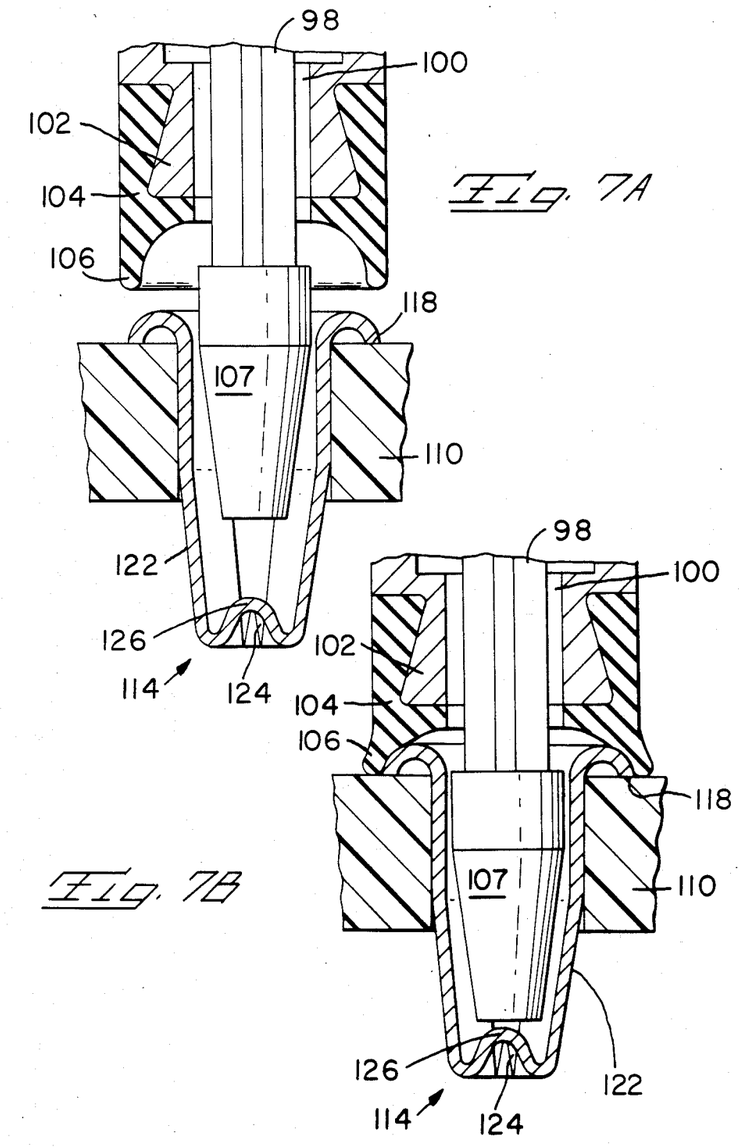
FIGS. 7A to 7D are fragmentary sectional views illustrating the operation of the tool shown in FIGS. 5 and 5A.
Figures 7C, 7D, 7E:
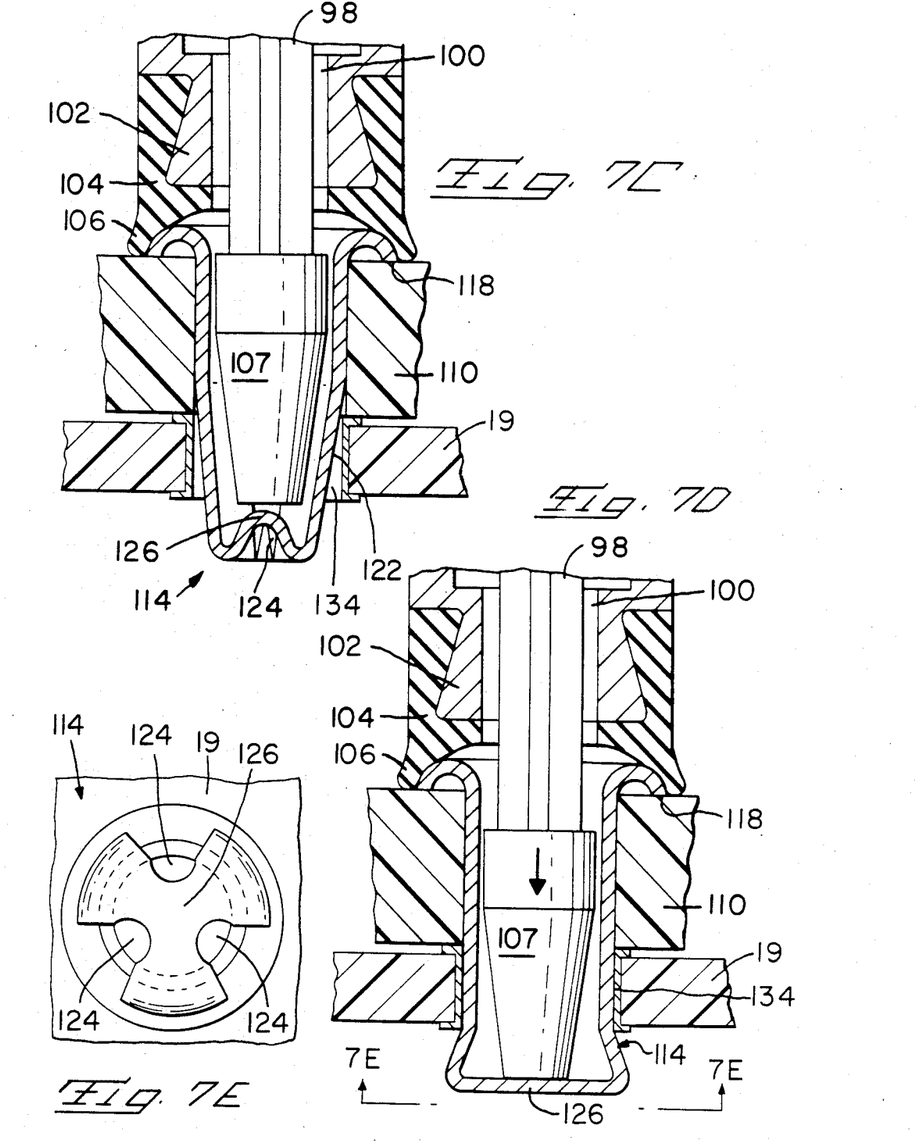
FIG. 7E is a view taken on the lines 7E—7E of FIG. 7D.

As shown in FIGS. 7A to 7C, the bottom 126 of the tapered portion 122 is bowed inwardly thereof to form a rounded dimple projecting into the interior of the rivet 114. There also depend from the housing 108, contact tails 128 which are connected to contacts 130 projecting laterally from the housing 108 on a contact platform 132 thereof.

In order to pick up a connector from the station 21, the robot 2 lowers the head 20 towards the connector, so that each tool head 107 enters a respective rivet 114 as shown in FIG. 7A, the arms 34 having previously been angularly adjusted in conformity with the spacing between the rivets 114 of the connectors to be picked up, and secured in their positions of adjustment by tightening the screws 46. The robot 2 continues to lower the head 20, until, as shown in FIG. 7B, the sealing lip 106 is firmly seated about the head 116 of the rivet 114, in sealing tight engagement therewith. At this stage, the leading end 109 of the riveting head 107 lies just above the arcuate bottom 126 of the rivet 114. The chambers 92 and 94 are now evacuated by way of the nozzles 96 so that each lip 106 is forced by the external air pressure, against the respective rivet head 116 whereby the riveting tools 26 are secured to the connector 25'.

Although some external air will enter the rivets through the slots 124 therein, the vacuum pump is powerful enough to ensure that each tool is secured within to its rivet firmly enough to allow the connector 25' to be raised with the head 20 and transferred to the board 19 with the portion 122 of each rivet inserted through a lined hole 134 in the board 19 so that the bottom 126 of the rivet 114 projects below the board 19, as shown in FIG. 7C. The unit 52 is now actuated to retract its psiton rod 54, so that the bar 68 forces each riveting tool 78 down against the action of its spring 82 to flatten out the arcuate bottom 126 of the respective rivet 114 as shown in FIG. 7D, so that the part of each rivet 114 which projects below the board 19 is expanded as shown in FIG. 7D to secure the connector 25' to the board 19. This deformation of the rivet is assisted by the slots 124 therein. The vacuum is now released, under the control of the microprocessor and the head 20 is raised by the robot 2 to withdraw the riveting head 107 from the rivets 114 and to return the head 20 to the pick-up station 21, leaving the connector 25', secured to the board 19. The expanded rivet 114 is shown from below, in FIG. 7E.

Figures 8, 8A:
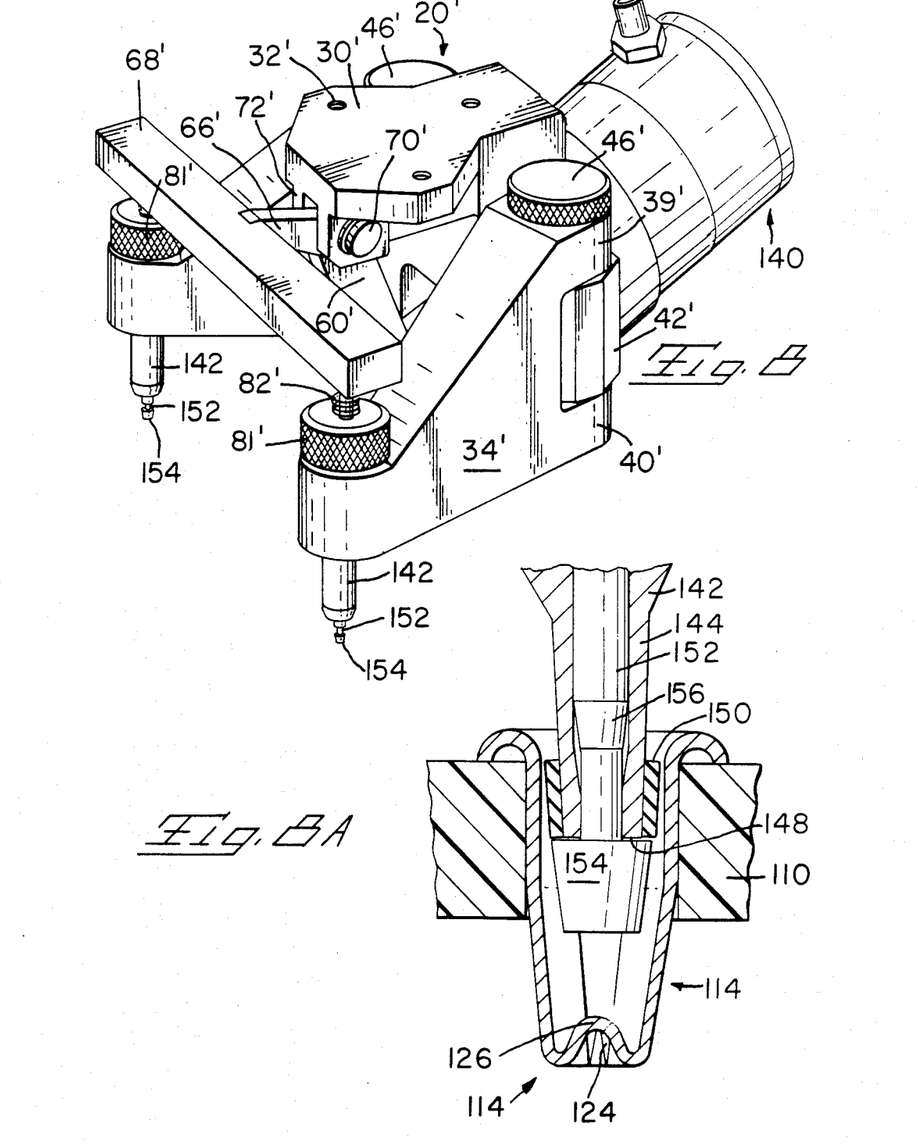
FIG. 8 is an isometric view drawn to a smaller scale than FIG. 2, of an electrical connector pick-up head according to a second embodiment of the invention.
FIGS. 8A to 8C are fragmentary sectional views illustrating the operation of a riveting tool of the pick-up head of FIG. 8.

The riveting head according to the second embodiment of the invention will now be described with reference to FIG. 8 to 8D. As shown in FIG. 8, the head according to the second embodiment, which is referenced 20', is identical with the head 20, excepting in respect to the construction of the riveting tools and in that the unit 52 is replaced by a tandem, or two stroke piston and cylinder unit 140. Those parts of the head 20' which are the same as those described above with reference to the head 20 bear the same reference numerals but with the addition of a prime symbol.

Figures 8B, 8C, 8D:
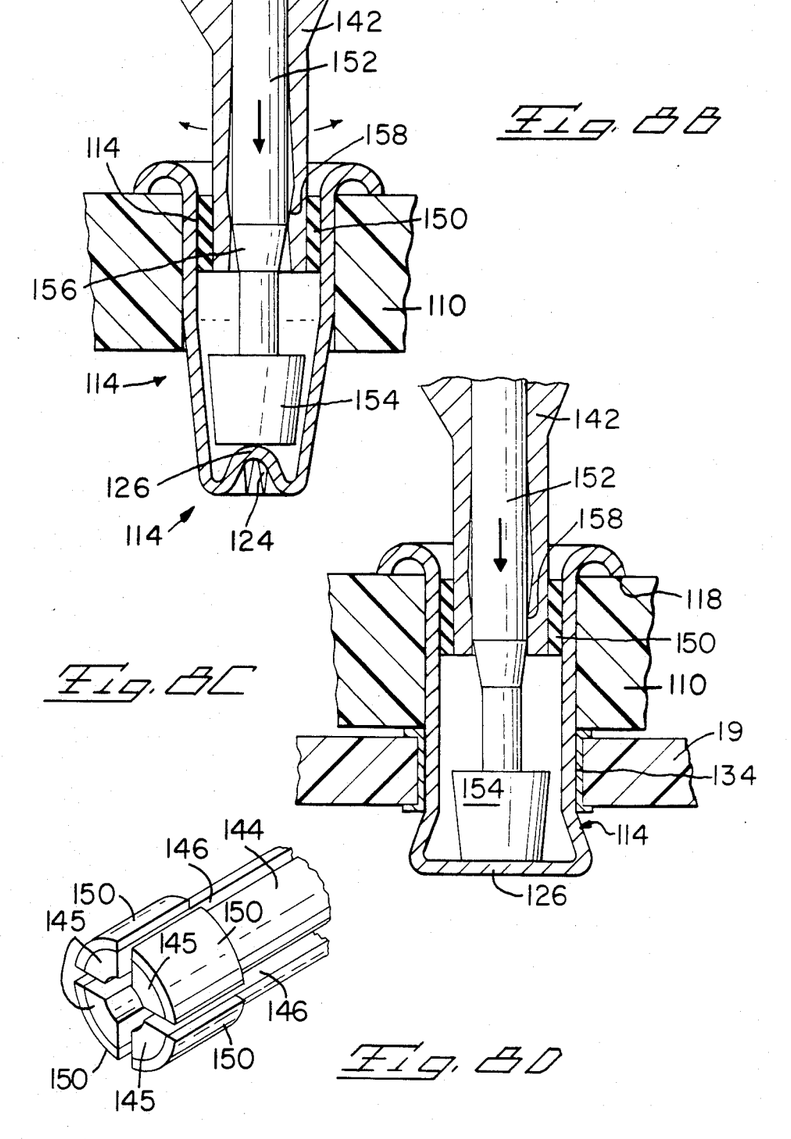
FIG. 8D is a fragmentary isometric view of a detail of the riveting tool shown in FIGS. 8A to 8C.

In the head 20', the tube 74 of the head 20 is replaced by a tube 142, the reduced cross section free end portion 144 of which is divided into four segments 145 by longitudinal slots 146 therein which open into the free end 148 of the tube 142 as best seen in FIG. 8D. Each segment 145 has secured to its radially outer surface, an elastomeric friction pad 150 of a synthetic rubber material, for example neoprene. The shaft 98 of each riveting tool of the head 20 is replaced in the head 20' by a circular cross section shaft 152 carrying a frustoconical riveting head 154 and having, spaced back therefrom, a frustoconical camming portion 156 tapering towards the riveting head 154, the tube portion 144 having therein a radially inwardly projecting cam follower surface 158 within each of the segments and beneath the pad 150 thereon.

When a connector is to be picked up, the head 20' is lowered towards the pick-up station 21, so that each riveting head 154 and the pads 150 thereabove are received in a respective rivet 114 as shown in FIG. 8A. The unit 140 is then actuated to retract its piston rod through a first stroke, to drive the shaft 152 down, as shown in FIG. 8B, so that its cam surface 156 engages the cam surface 158 of the segments 145, thereby forcing them apart so that the pads 150 frictionally engage the internal wall of the rivet 144 as shown in FIG. 8B thereby releasably securing the riveted tools to the rivets to allow the connector to be picked up by the robot 2 and transferred to the board 19. When the rivets have been inserted through the holes 134 in the board 19, the unit 140 is actuated to drive each shaft 152 through a second advance stroke so that, as shown in FIG. 8C, the riveting heads 154 are driven down to expand the rivet 114 to secure the connector 25' to the board 19. When this has been done, the unit 140 is actuated to advance its piston rod so as to return the shafts 152 to their FIG. 8 positions, whereby the robot 2 can raise the head 20' leaving the connector 25' secured to the board 19.

We claim:

1. A pick-up head for use in picking up a workpiece having a pair of hollow rivets depending in spaced relationship from a lower surface thereof and opening into an upper surface thereof, and moving the workpiece towards a board to place said lower surface thereon thereby to insert said rivets into predetermined holes in the board, the pick-up head comprising:
    a body having a vertical central axis and an upper face;
    means on said upper face for attaching said body to a longitudinally movable shaft with said central axis coincident with the axis of the shaft;
    a pair of workpiece pick-up arms each pivotally attached at one end of said body, for movement towards and away from each other about pivotal axes extending alongside, and on opposite sides of, said central axis;
    means for releasably retaining said arms in desired relative angular positions about said pivotal axes;
    an elongate riveting tool mounted for axial movement in the other end of each pick-up arm in a direction parallel to said central axis;
    means for releasably securing each riveting tool to a rivet into which the tool has been inserted, to allow the pick-up head to pick up the workpiece; and
    drive means on said body for driving each riveting tool through a working stroke to secure said rivet in said predetermined hole in said board and through a return stroke to withdraw said riveting tool from said rivet.

2. A pick-up head as claimed in claim 1, further comprising means ganging said riveting tools, said drive means comprising a piston and cylinder drive unit fixed to said body and a linkage operatively coupling a piston rod of said drive unit to said ganging means.

3. A pick-up head as claimed in claim 2, in which said ganging means comprises a bar pivotally connected to said body, a cap on each tool being slidable along said bar to allow adjustment of the angular positions of said pick-up arms about said pivotal axes.

4. A tool as claimed in claim 3, in which said other end of each pick-up arm carries a tube extending parallel to said central axis and in which one of said tools is slidably mounted, resilient means acting between the cap on said tool and said sleeve urging said cap against said bar.

5. A pick-up head as claimed in claim 2, in which said ganging means comprises a bar spanning said riveting tools, a ball crank pivotally connected to said body, having a first arm carrying said bar and a second arm connected to a piston rod of said unit, so that retraction of said piston rod by said unit causes said bar to drive the riveting tools simultaneously through a working stroke.

6. A pick-up head as claimed in claim 1, in which each pick-up arm has a pair of flanges projecting from said one end thereof and being spaced from one another in the direction of said central axis, the body having a pair of opposed lugs projecting laterally therefrom and each being received between the flanges of a respective one of said pick-up arms, a pivot pin extending through bores formed in each pair of flanges and in the lug received therebetween, a flange of each arm receiving a screw, threaded into the pivot pin received in the bore of said arm and being tightenable to secure said arm in a predetermined angular position.

7. A pick-up head as claimed in claim 1, comprising a tube fixed to each pick-up arm and extending parallel to said central axis and receiving one of said riveting tools, said tube terminating in means for sealing said tube to said rivet, and means being provided for evacuating said tube releasably to secure said tube to said rivet to allow said workpiece to be picked up by the pick-up head.

8. A pick-up head as claimed in claim 7, in which said sealing means comprises a sealing gasket surrounding said tube and having a sealing lip projecting from said tube for seating against a head of said rivet, each riveting tool comprising a shaft extending through said tube and carrying a riveting head projecting beyond said sealing lip, said tube being of circular cross section and said shaft being of triangular cross section.

9. A pick-up head according to claim 1, in which each pick-up arm has fixed to said other end thereof, a tube extending parallel to said central axis, and slidably receiving one of said riveting tools, said tube having an elastomeric outer peripheral surface which is resiliently expensible by said tool to grip the interior of a rivet into which said tool has been inserted, said drive means being adapted to drive said tool through a first increment of its working stroke to expand said tube, and to retract said tool to allow said tube to contract.

10. A pick-up head according to claim 9, in which said tube is longitudinally divided into segments, a friction pad of elastomeric material being provided on the external surface of each segment.

11. A pick-up head according to claim 10, in which said tool is provided with a frustoconical cam surface tapering towards a riveting head in which said tool terminates, each segment being formed with an internal cam follower surface projecting radially inwardly of the tube for cooperation with said cam surface for expanding and contracting said tube.

* * * * *